United States Patent
Yew et al.

[11] Patent Number: 6,025,264
[45] Date of Patent: Feb. 15, 2000

[54] FABRICATING METHOD OF A BARRIER LAYER

[75] Inventors: Tri-Rung Yew, Hsinchu Hsien; Water Lur; Shih-Wei Sun, both of Taipei; Yimin Huang, Taichung Hsien, all of Taiwan

[73] Assignee: United Microelectronics Corp., Hsin-Chu, Taiwan

[21] Appl. No.: 09/052,608

[22] Filed: Mar. 31, 1998

[30] Foreign Application Priority Data

Feb. 9, 1998 [TW] Taiwan .................................. 87101691

[51] Int. Cl.$^7$ ........................................... H01L 21/28
[52] U.S. Cl. ........................ 438/627; 438/629; 438/633; 438/638; 438/643; 438/647; 438/657
[58] Field of Search ............................. 438/623, 627, 438/629, 633, 638, 639, 643, 644, 647, 653, 654, 657, 684; 257/751, 752, 753, 754, 759

[56] References Cited

U.S. PATENT DOCUMENTS

| | | | |
|---|---|---|---|
| 5,466,971 | 11/1995 | Higuchi | 257/751 |
| 5,604,156 | 2/1997 | Chung et al. | 438/620 |
| 5,686,323 | 11/1997 | Kataoka | 438/369 |
| 5,739,579 | 4/1998 | Chiang et al. | 257/635 |
| 5,744,376 | 4/1998 | Chan et al. | 438/643 |
| 5,814,557 | 9/1998 | Venkatraman et al. | 438/622 |

FOREIGN PATENT DOCUMENTS

| | | |
|---|---|---|
| 0 305 296 | 3/1989 | European Pat. Off. . |
| 0 315 422 | 5/1989 | European Pat. Off. . |
| 0 488 576 | 6/1992 | European Pat. Off. . |
| 0 799 903 | 10/1997 | European Pat. Off. . |
| 2 314 456 | 12/1997 | United Kingdom . |
| WO 92/20099 | 11/1992 | WIPO . |
| WO 98/19330 | 5/1998 | WIPO . |

OTHER PUBLICATIONS

*IBM Technical Disclosure Bulletin vol. 33, No. 11*, "Copper Multilevel Interconnections", pp. 299–300, Apr. 1991.
Price, et al., *Thin Solid Films vol. 308–309*, "Damascene copper interconnects with polymer ILDs", pp. 523–528, Oct. 1997.
Copy of Search Report for FR 9812017.

*Primary Examiner*—T. N. Quach
*Attorney, Agent, or Firm*—Merchant & Gould P.C.

[57] ABSTRACT

A method for forming a barrier layer comprising the steps of first providing a semiconductor substrate that has a conductive layer already formed thereon. Then, a dielectric layer such as an organic low-k dielectric layer is deposited over the conductive layer and the semiconductor substrate. Next, an opening in formed in the dielectric layer exposing the conductive layer. Thereafter, a first barrier layer is deposited into the opening and the surrounding area. The first barrier layer can be a silicon-contained layer or a doped silicon (doped-Si) layer formed by a plasma-enhanced chemical vapor deposition (PECVD) method, a low-pressure chemical vapor deposition (LPCVD) method, an electron beam evaporation method or a sputtering method. Finally, a second barrier layer is formed over the first barrier layer. The second barrier layer can be a titanium/titanium nitride (Ti/TiN) layer, a tungsten nitride (WN) layer, a tantalum (Ta) layer or a tantalum nitride (TaN) layer.

23 Claims, 5 Drawing Sheets

FABRICATING METHOD OF A BARRIER LAYER

CROSS-REFERENCE TO RELATED APPLICATION

This application claims the priority benefit of Taiwan application Ser. No. 87101691, filed Feb. 9, 1998, the full disclosure of which is incorporated herein by reference.

BACKGROUND OF THE INVENTION

1. Field of Invention

The present invention relates to a method of fabrication a barrier layer. More particularly, the present invention relates to a method of fabrication a barrier layer that can enhance the adhesion of a via with low-k dielectric sidewalls.

2. Description of Related Art

In general, as the level of integration of integrated circuits increases, the number of metal interconnects necessary for interconnecting devices increases correspondingly. This is especially true in the fabrication of deep sub-micron VLSI circuits. One important and highly desirable property of metallic interconnects is a good electrical conductivity even when the contact area is very small. At present, the most common material for forming metallic interconnects is aluminum. However, copper has a lower resistance and a higher melting point. Therefore, as the level of integration continues to increase, copper has the potential to replace aluminum as a material for forming interconnects in the generation to come despite the many foreseeable problems that still exist.

FIG. 1 is a cross sectional diagram showing a conventional barrier layer structure. As shown in FIG. 1, the barrier layer structure is formed by first providing a semiconductor substrate 10, wherein a conductive layer 11 such as a metallic line structure has already been formed above the substrate 10. Then, a dielectric layer 12 is formed over the conductive layer 11 and the substrate 10. The dielectric layer 12 can be formed using a low-k dielectric material. Next, a via 14 is formed in the dielectric layer 12, and then a highly conductive material such as tungsten, copper or aluminum is deposited into the via 14. In general, a barrier layer is also formed between the via 14 and the conductive layer and between the via 14 and the dielectric layer 12. The reason for forming the barrier layer 13 is to increase adhesion of conductive material onto the sides of the vial 4 as well as to prevent the diffusion of conductive material into the dielectric layer. Nowadays, the most commonly used barrier layer materials include titanium/titanium nitride (Ti/TiN), tungsten nitride (WN),tantalum (Ta) and tantalum nitride (TaN).

FIG. 2 is a cross-sectional view showing a conventional barrier layer structure formed by a damascene process. As shown in FIG. 2, the barrier layer structure is formed by first providing a semiconductor substrate 20 having a conductive layer 21 formed thereon. The conductive layer can be a first metallic line structure, for example. Next, a dielectric layer 22 is formed over the conductive layer 21 and substrate 20. The dielectric layer 22 can be formed using a low-k dielectric material. Thereafter, a second opening 24 and a first opening 23 are sequentially formed in the dielectric layer 22. Subsequently, a barrier layer 25 is formed over the first opening 23 and the second opening 24. In general, the most common used barrier layer materials include titanium/titanium nitride (Ti/TiN), tungsten nitride (WN), tantalum (Ta) and tantalum nitride (TaN). The reason for having a barrier layer 13 is to increase the adhesive strength of subsequently deposited conductive material as well as to prevent the diffusion of conductive material to the dielectric layer. In the subsequent step, a conductive layer 26 is deposited into the openings 23 and 24 and over the dielectric layer 22. The conductive layer 26 can be formed using a material that has good electrical conductivity, for example, tungsten, copper or aluminum. Finally, the conductive layer 26 is planarized using a chemical-mechanical polishing (CMP) operation to complete the damascene fabricating process. The advantage of using a damascene process includes its capacity for forming both a via and a second metallic line structure in the same processing operation. For example, a via structure is formed in the first opening 23 and a second metallic line structure is formed in the second opening 24.

The aforementioned methods of fabricating a barrier layer do have defects. First, if the material used for filling the via is copper (future trend), since cross-diffusion between copper and dielectric material is very strong, a barrier formed using conventional material and method cannot prevent diffusion. Organic low-k dielectric material is often used as a dielectric layer but the organic low-k dielectric material has poor adhesion with a conventional barrier layer material. This is because a low-k dielectric material has a high moisture absorption capacity; this is especially true for an organic low-k dielectric material. Therefore, a layer of moisture will be retained on the surface layer of the dielectric material. Hence, the dielectric layer can provide only poor adhesion with the subsequently deposited barrier layer and conductive layer.

In light of the foregoing, there is a need to provide a method of fabrication a barrier layer.

SUMMARY OF THE INVENTION

Accordingly, the present invention is to provide a method of fabricating a barrier layer that can increase the adhesion between a low-k dielectric layer and a barrier layer as well as to enhance the capacity of a barrier layer to prevent the diffusion of conductive material. In addition, the barrier layer is able to protect the surface of the low-k dielectric layer and minimize the effect of having a moisture-absorbing surface.

To achieve these and other advantages and in accordance with the purpose of the invention, as embodied and broadly described herein, the invention provides a method of fabricating a barrier layer. First, a semiconductor substrate that has a conductive layer formed thereon is provided. Then, a dielectric layer such as an organic low-k dielectric layer is deposited over the conductive layer and the semiconductor substrate. Next, an opening is formed in the dielectric layer to expose the conductive layer. Thereafter, a first barrier layer is deposited into the opening and the surrounding area. The first barrier layer can be a silicon-containing layer or a doped silicon (doped-Si) layer formed by a plasma-enhanced chemical vapor deposition (PCVD) method, a low-pressure chemical vapor deposition (LPCVD) method, an electron beam evaporation method or a sputtering method. Finally, a second barrier layer is formed over the first barrier layer. The second barrier layer can be a titanium/titanium nitride (Ti/TiN) layer, a tungsten nitride (WN) layer, a tantalum (Ta) layer or a tantalum nitride (TaN) layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
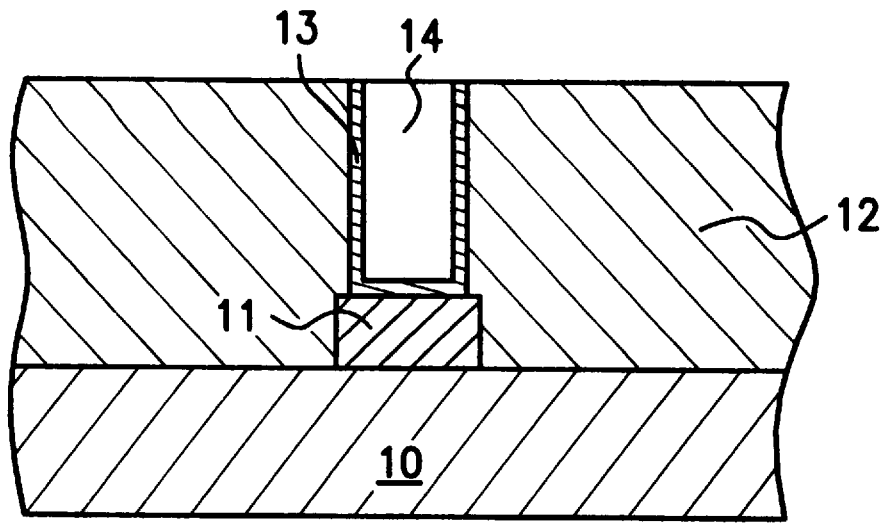
FIG. 1 is a cross sectional diagram showing a conventional barrier layer structure.
Figure 2:
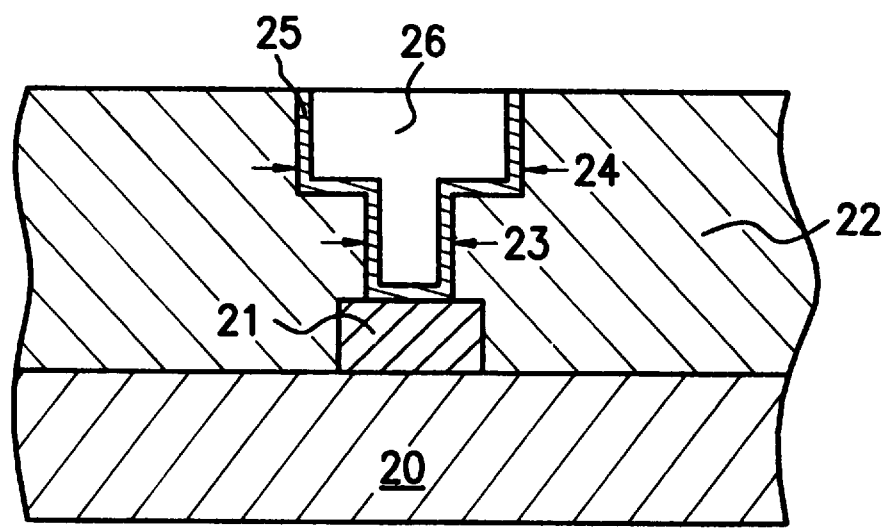
FIG. 2 is a cross-sectional view showing a conventional barrier layer structure formed by a damascene process.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are cross-sectional views showing the progression of manufacturing steps for forming a barrier layer over the surface of a via according to a first preferred embodiment of this invention.

Figure 3A:
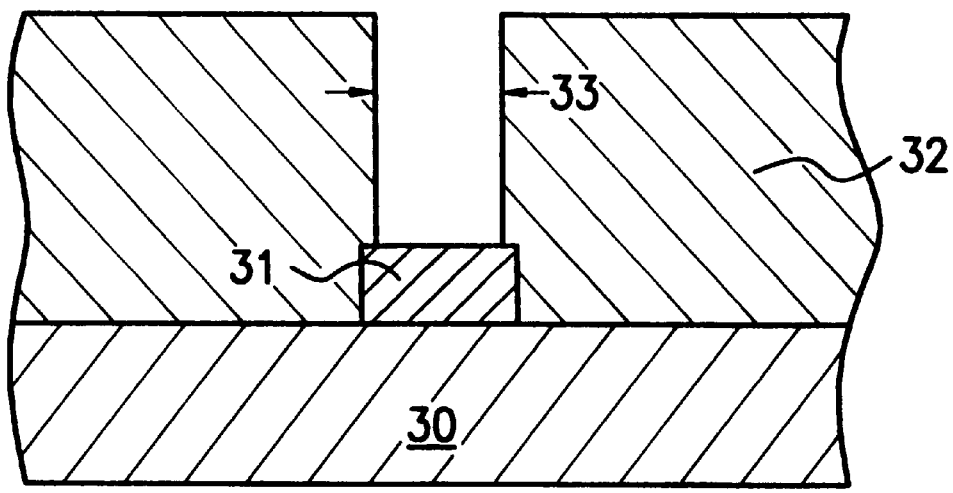
FIGS. 3A through 3D are cross-sectional views showing the progression of manufacturing steps for forming a barrier layer over the surface of a via according to a first preferred embodiment of this invention.

First, in FIG. 3A, a semiconductor substrate 30 having a conductive layer 31 formed thereon is provided. The conductive layer 31, for example, can be the source/drain region of a transistor or part of a metallic line structure. Next, a dielectric layer 32 is formed over the conductive layer 31 and the semiconductor substrate 30. The dielectric layer 32, can be, for example, an organic low-k dielectric layer or an oxide layer. Subsequently, the dielectric layer 32 is patterned to form an opening 33 exposing the conductive layer 31.

Figure 3B:
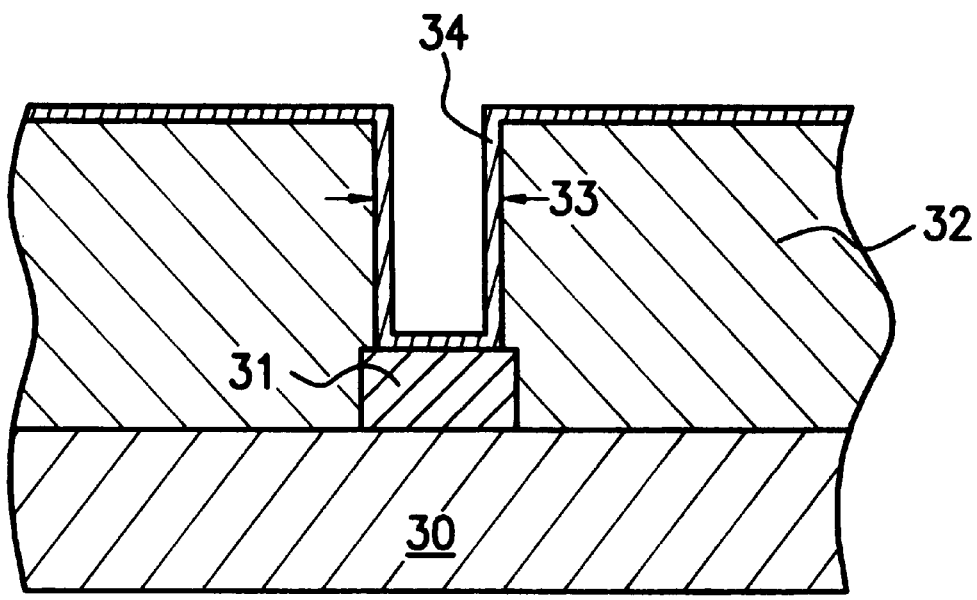

Next, as shown in FIG. 3B, the exposed semiconductor substrate 30 and the exposed dielectric layer 32 is cleaned using a dry or wet cleaning method. Thereafter, a plasma treatment is conducted to clean the exposed semiconductor substrate 30 and the exposed dielectric layer 32. The plasma treatment can be carried out using a plasma containing argon (Ar), hydrogen ($H_2$) or argon/hydrogen. Subsequently, a thin first barrier layer 34 is formed over the opening 33 and surrounding areas. The first barrier layer 34 preferably having a thickness below 300Å is a doped silicon layer (doped-Si) or a silicon-doped layer. The first barrier layer 34 can be formed by, using a plasma-enhanced chemical vapor deposition (PECVD) method, a low-pressure chemical vapor deposition (LPCVD) method, an electron beam evaporation method or a sputtering method. The first barrier layer 34 is able to increase its adhesion with an organic low-k dielectric layer and lower moisture absorption of the organic dielectric layer.

Figure 3C:
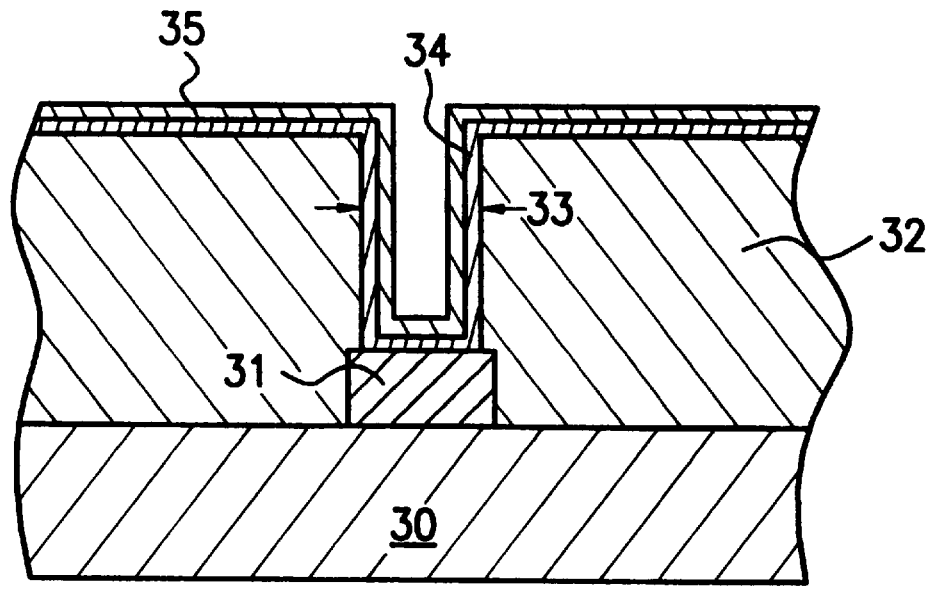

Next, as shown in FIG. 3C, a second barrier layer 35 is formed over the first barrier layer 34. The second barrier layer 35, for example, can be a titanium/titanium nitride (Ti/TiN) composite layer, a tungsten nitride (WN) layer, a tantalum (Ta) layer or a tantalum nitride (TaN) layer, and is formed using a chemical vapor deposition method.

Figure 3D:
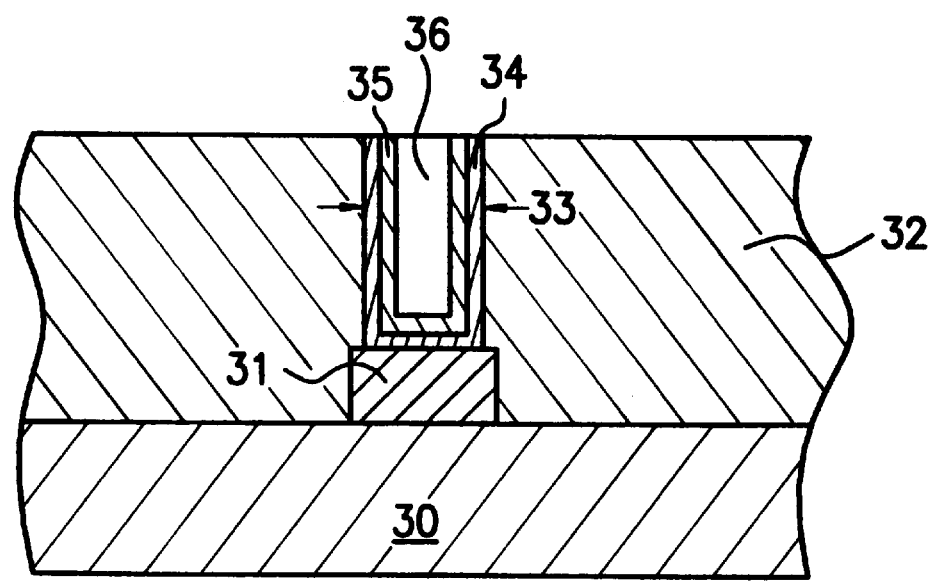

Finally, as shown in FIG. 3D, conductive material such as tungsten, copper or aluminum is deposited over the dielectric layer 32 and fills the opening 33. Then, the conductive layer is polished to expose the dielectric layer 32 using a chemical-mechanical polishing method. Hence, a via structure 36 is formed.

FIGS. 4A through 4D are cross-sectional views showing the progression of manufacturing steps for forming a barrier layer using a damascene process according to a second preferred embodiment of this invention.

Figure 4A:
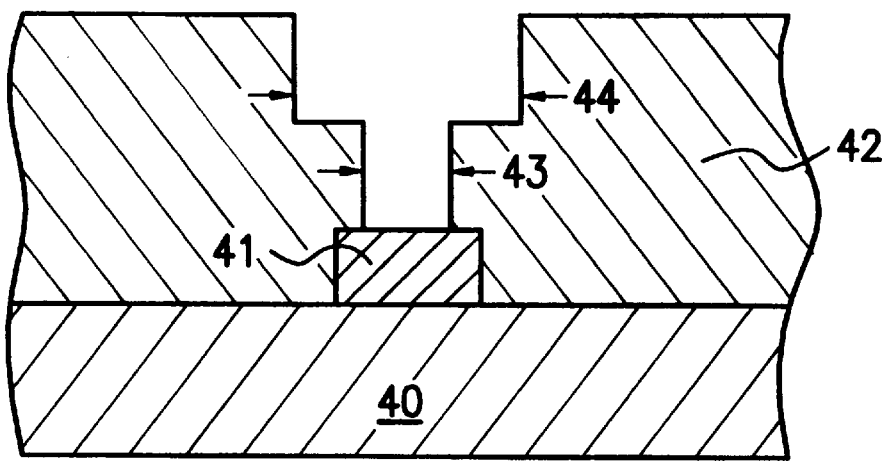
FIGS. 4A through 4D are cross-sectional views showing the progression of manufacturing steps for forming a barrier layer using a damascene process according to a second preferred embodiment of this invention.

First, in FIG. 4A, a semiconductor substrate 40 having a conductive layer 41 formed thereon is provided. The conductive layer 41 can be, for example, the source/drain region of a transistor or part of a metallic line structure. Next, a dielectric layer 42 is formed over the conductive layer 41 and the semiconductor substrate 40. The dielectric layer 42 can be, for example, an organic low-k dielectric layer or an oxide layer. Subsequently, the dielectric layer 42 is patterned to form a first opening 44, where depth of the first opening 44 is smaller than the thickness of the dielectric layer 42. After that, the dielectric layer 42 is further etched to form a second opening 43 that exposes the conductive layer 41 below the first opening 44, where the second opening 43 has a width smaller than the first opening 44.

Figure 4B:
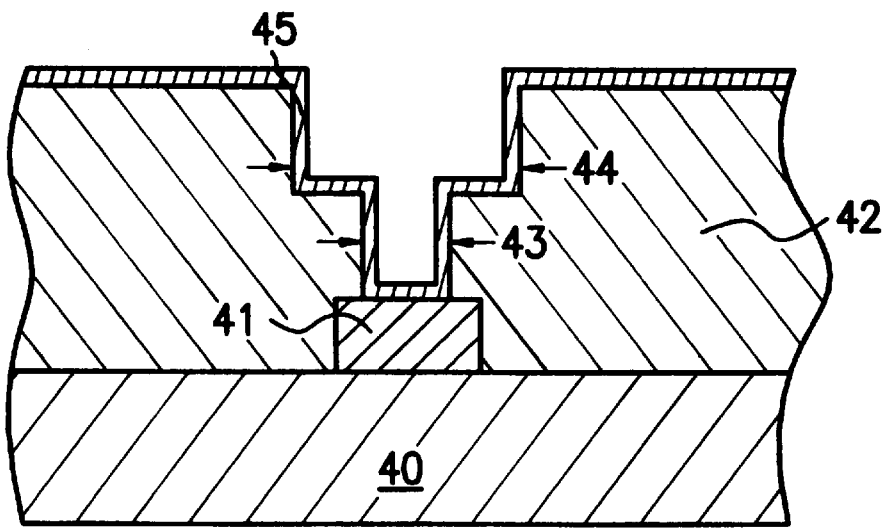

Next, as shown in FIG. 4B, the exposed semiconductor substrate 40 and the exposed dielectric layer 42 are cleaned using a dry or wet cleaning method. Thereafter, a plasma treatment is further conducted to clean the exposed semiconductor substrate 42 and the exposed dielectric layer 42. The plasma treatment can be carried out using a plasma containing argon (Ar), hydrogen ($H_2$) or argon/hydrogen. Subsequently, a first barrier layer 45 is formed over the first opening 44, the second opening 43 and surrounding areas. The first barrier layer 45, preferably having a thickness below 300Å, is a doped silicon layer (doped-Si) or a silicon-doped layer. The first barrier layer 45 can be formed by using a plasma-enhanced chemical vapor deposition (PECVD) method, a low-pressure chemical vapor deposition (LPCVD) method, an electron beam evaporation method or a sputtering method. The first barrier layer 45 is able to increase its adhesion with an organic low-k dielectric layer and lower moisture absorption of the organic dielectric layer.

Figure 4C:
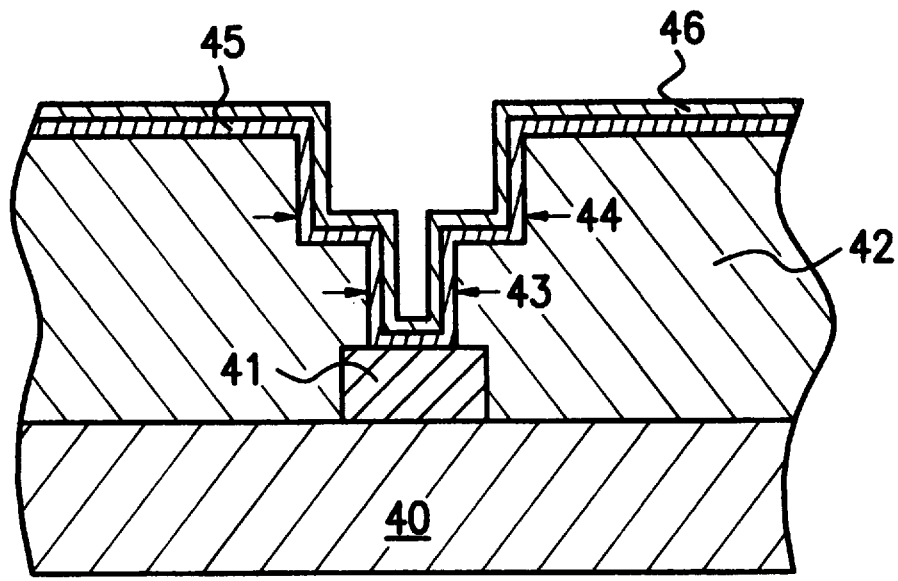

Next, as shown in FIG. 4C, a second barrier layer 46 is formed over the first barrier layer 45. The second barrier layer 46 can be, for example, a titanium/titanium nitride (Ti/TiN) composite layer, a tungsten nitride (WN) layer, a tantalum (Ta) layer or a tantalum nitride (TaN) layer formed using a chemical vapor deposition method.

Figure 4D:
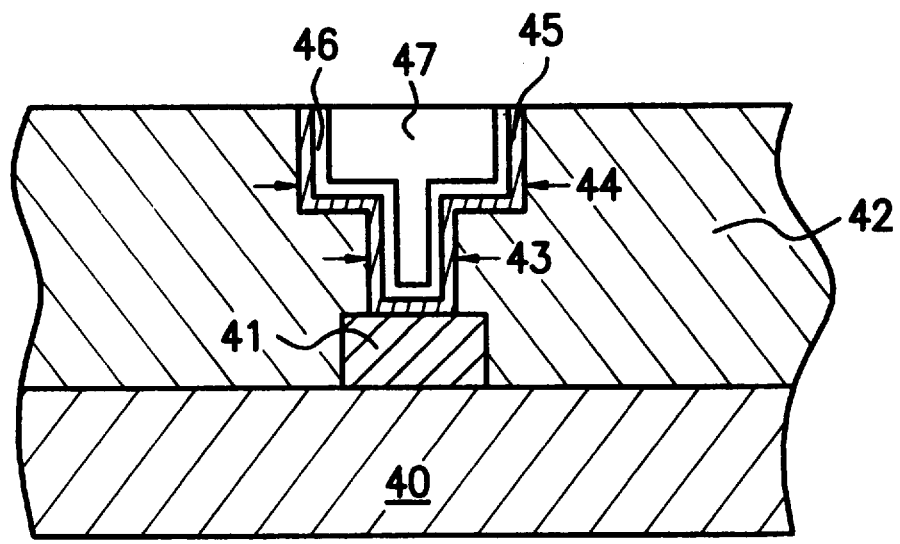

Finally, as shown in FIG. 4D, conductive material such as tungsten, copper or aluminum is deposited over the dielectric layer 42 and fills the first opening 44 and the second opening 43. Then, the conductive layer is polished to expose the dielectric layer 42 using a chemical-mechanical polishing method. Hence, a via structure formed by a damascene process is established. The advantage of using a damascene process includes its capacity for forming both a via and a second metallic line structure in the same processing operation. For example, a via structure is formed in the second opening 43, while a second metallic line structure is formed in the first opening 44.

As a summary, the method of forming a barrier layer includes the following characteristics:

(1) The first barrier layer 34, for example, a doped silicon (doped-Si) layer, is able to increase its adhesion with the organic low-k dielectric layer 32.

(2) The first barrier layer 34 is able to protect the surface of the organic low-k dielectric layer 32. Hence, the effect of having moisture in the dielectric layer 32 will be minimized.

(3) The first barrier layer 34 of this invention is able to reduce stress between the dielectric layer 32 and subsequently deposited metallic layer 36.

(4) The first barrier layer 34 together with the second barrier layer 35 increase the capacity to seal off diffusion of subsequently deposited metallic layer 36.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a barrier layer comprising the steps of:

providing a semiconductor substrate that has a conductive layer formed thereon;

forming an organic low-k dielectric layer over the conductive layer and the semiconductor substrate and then forming an opening in the dielectric layer to expose the conductive layer;

forming a doped silicon first barrier layer over the sides of the opening and surrounding area;

forming a second barrier layer over the first barrier layer;

forming a conductive layer in the opening; and performing chemical-mechanical polishing to remove the conductive layer, the doped silicon first barrier layer and the second barrier layer so as to expose the organic low-k dielectric layer.

2. The method of claim 1, wherein the conductive layer includes the source/drain region of a transistor.

3. The method of claim 1, wherein the conductive layer includes a metal line structure.

4. The method of claim 1, wherein the first barrier layer has a thickness below 300Å.

5. The method of claim 1, wherein the step of forming the first barrier layer includes a plasma-enhanced chemical vapor deposition (PECVD) method.

6. The method of claim 1, wherein the step of forming the first barrier layer includes a low-pressure chemical vapor deposition (LPCVD) method.

7. The method of claim 1, wherein the step of forming the first barrier layer includes an electron beam evaporation method.

8. The method of claim 1, wherein the step of forming the first barrier layer includes a sputtering method.

9. The method of claim 1, wherein the step of forming the second barrier layer includes depositing titanium (Ti) and then titanium nitride (TiN) to form a titanium/titanium nitride (Ti/TiN) composite layer.

10. The method of claim 1, wherein the step of forming the second barrier layer includes depositing tungsten nitride (WN).

11. The method of claim 1, wherein the step of forming the second barrier layer includes depositing tantalum (Ta).

12. The method of claim 1, wherein the step of forming the second barrier layer includes depositing tantalum nitride (TaN).

13. The method of claim 1, wherein the material used for forming the conductive layer is selected from a group consisting of tungsten, copper and aluminum.

14. A method for forming a barrier layer that can be applied to a damascene process, comprising the steps of:

providing a semiconductor substrate that has a conductive layer formed thereon;

forming a dielectric layer over the conductive layer and the semiconductor substrate and then forming a first opening in the dielectric layer, wherein the depth of the first opening is smaller than the thickness of the dielectric layer;

forming a second opening that exposes the conductive layer by continuing to etch down from the first opening, wherein the width of the second opening is smaller than the first opening;

forming a doped silicon first barrier layer over the sides of the first opening, the second opening and surrounding area; and forming a second barrier layer over the first barrier layer.

15. The method of claim 14, wherein the step of forming the dielectric layer includes depoganic low-k dielectric.

16. The method of claim 14, wherein the first barrier layer has a thickness below 300Å.

17. The method of claim 14, wherein the step of forming the first barrier layer includes a plasma-enhanced chemical vapor deposition (PECVD) method.

18. The method of claim 14, wherein the step of forming the first barrier layer includes a low-pressure chemical vapor deposition (LPCVD) method.

19. The method of claim 14, wherein the step of forming the first barrier layer includes an electron beam evaporation method.

20. The method of claim 14, wherein the step of forming the first barrier layer includes a sputtering method.

21. The method of claim 14, wherein the material for forming the second barrier layer is selected from a first group consisting of titanium/titanium nitride (Ti/TiN), tungsten nitride (WN), tantalum (Ta) and tantalum nitride (TaN).

22. The method of claim 14, wherein after the step of forming the second barrier layer over the first barrier layer, further includes depositing a conductive material into the first opening and the second opening followed by a chemical-mechanical polishing (CMP) operation.

23. The method of claim 22, wherein the material for forming the conductive layer is selected from a second group consisting of tungsten, copper and aluminum.

* * * * *